United States Patent [19]

Blount et al.

[11] Patent Number: 5,222,217
[45] Date of Patent: Jun. 22, 1993

[54] SYSTEM AND METHOD FOR IMPLEMENTING OPERATING SYSTEM MESSAGE QUEUES WITH RECOVERABLE SHARED VIRTUAL STORAGE

[75] Inventors: Marion L. Blount, Mahopac; Stephen P. Morgan, Hartsdale, both of N.Y.; Katalin A. V. Rader, Austin; Robert K. Rader, Austin, Tex.; Shaheen-Gouda, Austin, Tex.

[73] Assignee: International Business Machines Corporation, Armonk, N.Y.

[21] Appl. No.: 298,384

[22] Filed: Jan. 18, 1989

[51] Int. Cl.$^5$ .................................. G06F 13/00
[52] U.S. Cl. .................... 395/325; 364/244.3; 364/244; 364/284.3; 364/256.3; 364/DIG. 1; 395/575
[58] Field of Search ... 364/200 MS File, 900 MS File; 395/325, 425, 650, 575

[56] References Cited

U.S. PATENT DOCUMENTS

| | | | |
|---|---|---|---|
| 4,313,162 | 1/1982 | Baun | 364/200 |
| 4,414,620 | 11/1983 | Tsuchimoto et al. | 395/200 |
| 4,430,700 | 2/1984 | Chadima | 364/200 |
| 4,432,057 | 2/1984 | Daniell | 364/200 |
| 4,459,655 | 7/1984 | Willemin | 364/200 |
| 4,525,800 | 6/1985 | Hameria | 395/575 |
| 4,543,627 | 9/1975 | Schwab | 395/200 |
| 4,562,539 | 12/1985 | Vince | 395/200 |
| 4,620,276 | 10/1986 | Daniell et al. | 395/200 |
| 4,622,631 | 11/1986 | Frank et al. | 395/800 |
| 4,718,002 | 1/1988 | Carr | 395/200 |
| 4,742,447 | 3/1988 | Duvall et al. | 395/375 |
| 4,777,595 | 10/1988 | Strecker | 364/200 |
| 4,814,979 | 3/1989 | Neches | 364/200 |
| 4,819,159 | 4/1989 | Shipley | 395/575 |
| 4,872,106 | 10/1989 | Slater | 395/575 |
| 4,887,076 | 12/1989 | Kent | 340/825.79 |

FOREIGN PATENT DOCUMENTS 8402409 6/1984 World Int. Prop. O. .

OTHER PUBLICATIONS

K. Li et al, "Memory Coherence in Shared Virtual Memory Systems" 1986 ACM, 5th annual symposium, 0-89791-198-9/86/0800-0229, pp. 229-239.

R. Fitzgerald et al, "The Integration of Virtual Memory Management and Interprocess Communication in Accent", ACM Transaction on Computer Systems, May 1986, vol. 4, No. 2.

J. F. Bartlett, "A Nonstop" Operating System, Tandem Computers, copyright 1977, pp. 453-460.

A. Chang et al, "801 Storage: Architecture and Programming", IBM T. J. Watson Research Center, Yorktown Heights, N.Y. pp. 1-14.

B. D. Fleisch, "Distributed Systems V IPC in Locus: A Design and Implementation Retrospective", 1986 ACM 0-89791-201-2/86/0800-0386, pp. 385-396.

Primary Examiner—Thomas C. Lee
Assistant Examiner—Eric Coleman
Attorney, Agent, or Firm—Wayne P. Bailey; Marilyn D. Smith

[57] ABSTRACT

A system for maintaining the reliability of shared data structures, such as message queues, in a multi-processor data processing system is disclosed. The system includes a plurality of virtual memory-type processor units in which the processors share virtual memory and can access each one of a plurality of virtual memory segments by the same virtual memory address. The system assures the reliability of system-wide shared data structures in the event of a failure of one of the processors by maintaining at least two copies of each data structure and by maintaining two copies of a table used in locating such data structures. The system updates copies of such shared data structures that are stored in at least two different processing units with the results of a specified data processing transaction, which may have affected the information in such data structures, in a manner to insure that either identical updates occur or no update occurs. The system further insures that any changes that might have occurred in the information stored in the data structure prior to the end of an aborted transaction is returned to the initial state to permit the transaction to be retried.

35 Claims, 8 Drawing Sheets

MSGQ INFORMATION TABLE

| CONTROL INFORMA-TION | ENTRY FOR MSGQID1 | ENTRY FOR MSGQID2 | | | ENTRY FOR MSGQID5 |
|---|---|---|---|---|---|
| 1      127 | 128      255 | 256      383 | 384      511 | 512      639 | 640      767 |

FIG. 3A

CONTROL INFORMATION FOR MSGQIT SEGMENT

| LOCK WORD | MAXIMUM NUMBER MSGQS |
|---|---|
| 0      31 | 32      63 |

FIG. 3B

MSGQ INFORMATION TABLE ENTRY

| | |
|---|---|
| FREE/USED FLAG | WORD 0 |
| KEY | WORD 1 |
| USE COUNT | |
| HEADER SEGMENT ID | |
| PAGE NUMBER | |
| TEXT SEGMENT ID | |
| ⋮ | WORD 31 |

MSGQ HEADER SEGMENT

| QUEUE HEADER | QUEUE HEADER | QUEUE HEADER | | | | | |
|---|---|---|---|---|---|---|---|

PAGE 0      PAGE 1                                                            PAGE 253

FIG. 3D

CREATION OF MSGQ INFORMATION TABLE

FIG. 5

- FIRST PROCESSOR 10A CREATES SEGMENT FOR MESSAGE QUEUE INFORMATION TABLE — 26
- OS IN 10A DESIGNATES (1) SEGMENT ID FOR MSGQIS — 28
- MSGQIT IS FORMATTED WITH EMPTY ENTRIES — 30
- OS IN 10A CALLS "COMMIT" — 32

FIG. 6B

(A)
- OS IN 10B UPDATES MSGQIT TABLE — 68
- OS IN 10B CALLS "COMMIT" — 70
- MSGQID RETURNED TO PROCESS — 72

FIG. 7B

(B)
- OS IN 10C ACQUIRES WRITE LOCK ON QUEUE HDR — 86
- OS IN 10C UPDATES SET OF ACCESS PERMISSIONS FOR QUEUE — 88
- OS IN 10C CALLS "COMMIT" — 90

SYSTEM AND METHOD FOR IMPLEMENTING OPERATING SYSTEM MESSAGE QUEUES WITH RECOVERABLE SHARED VIRTUAL STORAGE

FIELD OF THE INVENTION

This invention relates in general to virtual-memory data processing systems comprising a plurality of similar interconnected data processing units which share the same virtual storage addressing space. In particular, this invention relates to a system of, and method for, implementing reliable shared data structures, such as message queues, and system facilities in closely-coupled, multi-processor, "recoverable shared virtual-memory" data processing systems.

RELATED APPLICATIONS

U.S. Application Ser. No. 06/819,458 now U.S. Pat. No. 4,742,447 filed Jan. 16, 1986, in the name of Duvall, et al, entitled "Method to Control I/O Accesses in a Multi-Tasking Virtual Memory Virtual Machine Type Data Processing System", is directed to a method for use in a multi-user, page-segmented virtual memory data processing system in which a mapped file data structure is selectively created to permit all I/O operations to the secondary storage devices to be executed by simple load and store instructions under the control of the page fault handler.

U.S. Application Ser. No. 07/127,000 now abandoned filed Nov. 30, 1987, in the name of Blount, et al, entitled "Method for Reducing Disk I/O Accesses in a Multi-processor Clustered Type Data Processing System", is directed to a method for managing the storage of data in a shared virtual memory data processing system having a plurality of interconnected processor units, which permits a page fault which occurs in one processing unit to be serviced by transferring a copy of the requested page from the main storage of another processor unit whenever such a copy exists rather than performing an I/O paging operation to the disk file of the processor unit which experienced the page fault.

U.S. Application Ser. No. 07/126,820 now abandoned filed Nov. 30, 1987, in the name of Blount, et al, entitled "Method for Maintaining System Availability in a Multi-processor Data Processing System Employing a Shared Virtual Memory" is directed to an improved method for managing the shared virtual storage in a multi-processor, clustered-type data processing system to prevent loss of data or data consistency as the result of the failure of any single component of the configuration.

U.S. Application Ser. No. 07/298,398 now abandoned filed concurrently herewith in the name of Blount, et al, entitled "Intermachine Communication Services" is directed to a novel lightweight communications protocol for allowing direct communication between kernels of a plurality of processors in a closely-coupled, multi-processor data processing system.

BACKGROUND ART

The prior art has disclosed a number of virtual storage data processing systems which employ a single standalone Central Processing Unit (CPU). These systems generally employ a main storage having a plurality of individually addressable storage locations, each of which stores one byte of data and a secondary storage device such as a disk file which includes a plurality of block addressable storage locations, each of which stores a block of data. The virtual storage concept involves what is sometimes referred to as a single-level store. In a single-level store, the maximum address range of the system is generally much larger than the real capacity of the main storage. The main storage is made to appear much larger by the use of a paging mechanism and a secondary storage device which cooperate to keep the data required by the application program in main storage. The function of the paging mechanism is to transfer a page of data from the secondary storage device to main storage whenever a page, which is addressed by the application program is not in main storage. This is called a page fault. Transferring the page of data from the secondary storage device to main storage is called page fault handling.

The prior art has also disclosed a number of different multi-processor system configurations that are sometimes employed to obtain increased data processing power. A multi-processor system configuration may be thought of as a plurality of processing units sharing a logical communication channel. The logical communication channel may take the form of storage shared among the processing units into which messages from one processing unit to another processing unit may be placed. Additionally, the logical communication channel may take the form of a communication network (including shared buses) through which messages may travel from one processing unit to another processing unit.

In some prior art multi-processor system configurations referred to as tightly-coupled multi-processor configurations, the processing units in the configuration share some amount of storage which any of the processing units in the configuration may access. Each processing unit, however, may have some amount of private storage which only it and no other processing unit may access.

Computing systems arranged in a tightly-coupled multi-processor configuration have the benefit of rapid communication via shared storage and may also exploit the shared storage as a disk cache. A page fault may occur when an application program executing on one of the processing units in a tightly-coupled multi-processor configuration addresses a page of data that is not in main storage. During page fault handling, the appropriate secondary storage device connected to the configuration is commanded to place the appropriate page of data into the shared storage. Once the page of data has been placed in the shared storage, it may be addressed by any of the processing units in the configuration.

A practical limit, however, is reached for tightly-coupled multi-processor configurations when the contention for access to shared storage among the processing units in the configuration exceeds the benefit provided by the shared storage when used as a disk cache. For example, one processing unit in the configuration may attempt to change the contents of a page of data while another processing unit is attempting to examine the contents of the same page of data. Some mechanism must normally be provided by the configuration to lock out one of the processing units in favor of the other so that the two processing units see a consistent view of the data. Various methods exist in the prior art to enforce a consistent view of data upon the processing units in a tightly-coupled, multi-processor configuration.

These prior art methods involve idling one of the processing units in the configuration until the other processing unit has completed its access to shared storage. The processing unit that has been idled cannot be idle and also perform useful work; thus, contention for access to shared storage inevitably results in some loss of processing power for the configuration, when the configuration is considered as a whole. For these reasons, the number of processing units in a single tightly-coupled, multi-processor configuration rarely exceeds six.

In some prior art multi-processor system configurations referred to as closely-coupled or "clustered" multi-processor configurations, the plurality of processing units are connected via a communications network and each processing unit may access its own storage directly and no other processing unit has access to that storage. The processing units in a closely-coupled multi-processor configuration may share data by sending messages via the communications network to other processing units within the configuration.

In a variation on the closely-coupled multi-processor configuration, one of the processing units in the configuration operates as a shared storage processing unit. The main storage attached to the shared storage processing unit is used as a disk cache managed by the shared storage processing unit. The shared storage processing unit is also assigned the function of controlling which of the other processing units can have access to what area of the shared storage at what time and under what conditions.

More recently, the prior art has begun to configure standalone personal computers or standalone engineering work stations into a local area network. In such an arrangement, which is called a loosely-coupled multi-processor configuration or a distributed system configuration, any work station can communicate with another work station employing standard communication protocols. The motivation that exists for establishing such a loosely-coupled configuration is not necessarily more data processing power, but simply one of convenience of exchanging information electronically instead of non-electronically. However, it has been found in many situations that the individual work stations are running the same operating system.

A paper entitled "Memory Coherence in Shared Virtual Storage Systems" authored by Kai Li and Paul Hudak and presented at the *5th Annual Association for Computing Machinery Symposium on Principles of Distributing Computing*, 1986, discloses a plurality of virtual-memory data processing units interconnected in a clustered configuration. In this arrangement all units have the same operating system and address the same virtual address space. Each unit is the owner of a different set of files which is stored in that owner's storage system. A non-owner running an application program obtains access to the other unit's storage system through a suitable communication link, which causes requests to the file owner for virtual pages of data which are then returned to the requester. Each processing unit of the clustered configuration therefore shares the set of files in its virtual storage system with the other units in the configuration.

A paper entitled "The Integration of Virtual Memory Management and Interprocess Communication in Accent" authored by R. Fitzgerald and R. F. Rashid and published in the May, 1986 issue of *ACM Transactions on Computing Systems* 4(2) describes the Accent operating system, developed at Carnegie-Mellon University. The Accent operating system integrates virtual storage management and inter-process communication within the kernel such that large data transfers use storage mapping techniques, rather than data copying, to implement kernel services.

In multi-processor systems employing shared virtual storage, there are two pervasive problems. One is the emergence of partial failures and the resulting level of reliability offered by the system. The other is the added complexity and amount of special-purpose code required in the kernel to distribute its services.

When a uniprocessor system "crashes" or fails, the services supplied by the system and the users of the services crash together, so that a total failure is seen. In a distributed configuration, one processor may crash while others stay up—services supplied by the crashed processor are then seen by their users to have failed, giving rise to partial failures. In order to resume useful work, the system must first bring itself into a consistent state, which may be a difficult task. As a result, most multi-processor operating systems either "kill" and re-start affected applications from the beginning (or from a checkpoint), or they assume that applications and/or subsystems are willing to deal with partial failure on their own, and therefore provide little or no assistance, as discussed in a paper entitled "A Non-Stop Kernel" authored by J. F. Bartlett and published in *Proceedings of the Eighth Symposium on Operating System Principles* in December, 1981. One goal of a clustered system is transparency, i.e. users and application programs should not be aware of the existence of a plurality of processor units. Thus, steps must be taken to preclude or minimize the effect of partial failures in a clustered system.

In a clustered system of independent processors, communication is necessarily involved, so protocols are needed, and there may be special processes and other related facilities. If a single mechanism can be found which removes or reduces the need for the special facilities, this simplifies the implementation of the system services, which are now distributed, and makes it possible to optimize the underlying mechanism rather than putting effort into each special facility.

In prior art distributed data processing systems, it was common for one unit in the system which needed a particular function to request another processing unit in the distributed system to do the work for it. In effect, one processor shipped the service request to a different processor unit in the system which had been assigned that particular work function, and, accordingly had the necessary data structures available to accomplish the work. Such a "function shipping" implementation required the use of complicated code structures which made recovery from a partial failure difficult.

In addition, loosely-coupled microprocessor configurations disclosed in the prior art were traditionally designed around a message-passing communication model in which individual kernels running on separate processor units sent messages containing requests for services to other processor units within the configuration that managed configuration-wide shared resources. Reliance on such a message-passing model undoubtedly occurred because message passing corresponds naturally to the underlying communications connections among the processing units.

The difficulty of sharing complex data structures in a message-passing implementation is well known and is discussed in a paper entitled "A Value Transmission Method for Abstract Data Types" by M. Herlihy and B. Liskov and published in the *ACM Transactions on Programming Language Systems*, Vol. 4, No. 4 in October 1982, which is herein incorporated by reference. The difficulty of a message-passing model is further discussed in a doctoral dissertation entitled *Remote Procedure Call*, by B. Nelson and published by Carnegie-Mellon University in May 1981, which is also incorporated herein by reference.

In contrast, prior art operating systems for tightly-coupled micro-processor configurations have not traditionally been implemented around a message-passing model; rather, the processing units in the configuration share some amount of main storage where kernels share complex data structures in the main storage and pass among them only pointers to these structures. It is evident that operating systems originally developed for uniprocessors have, with some modifications in the areas of serialization and cache consistency been modified rather than rewritten to execute efficiently on such tightly-coupled, multi-processor configurations. It would be unusual and difficult to modify an operating system constructed around a message-passing model to execute on such tightly-coupled, multi-processor configurations.

In co-pending U.S. patent application Ser. No. 07/126,820, a novel system and method of "recoverable shared virtual storage (RSVS)" or "cluster" storage in a shared virtual storage, closely-coupled, multi-processor, data processing system is disclosed. Such a system achieves the goal of being a "high availability" data processing system which also allows for horizontal growth by employing a novel method which minimizes loss of data due to aborted transactions. Horizontal growth may be defined as adding processor units to a clustered system and achieving higher performance, either in reduced time to process a set of programs, or to allow more programs to be processed simultaneously without significantly extending the response time of the system.

A "transaction" is a unit of work performed by an application program that may update data stored in virtual storage that is shared among the processing units in a clustered configuration. A transaction runs under the thread of execution of a single process running a single program on a single processing unit in the clustered configuration. The novel system disclosed in the co-pending application maintains copies of data structures that are affected by identified transactions performed by one processor and only update the copies located on a different processor when a transaction has been committed. Transactions that must be aborted for any reason can therefore be retried since the information as it existed at the start of the transaction is available in the copy stored on another processor.

The co-pending application discloses an implementation of the invention based on the IBM AIX TM [1] operating system, which uses a form of shared virtual storage, provides atomic, serialized update semantics and provides Degree 3 consistency, also known as read-write serializability. Transactions are atomic in that either all of the changes made by a given transaction are made visible or none are, and it is possible to undo all changes at any time until they are committed. They are serializable in that the hardware locking support described in said application insures that, although several transactions may take place "simultaneously" the results are as if the transactions had taken place serially in some order.

[1]AIX is a registered trademark of IBM Corporation.

A paper entitled, "801 Storage: Architecture and Programming," by A. Chang and M. Mergen, and published in the *ACM Transactions on Computing Systems*, February, 1988, describes the concept of "database storage". In order to understand RSVS or cluster storage, it is useful to have some understanding of database storage.

An object, such as a file or a data structure, is mapped into a virtual storage segment. All users of the object access it at the same virtual address, which allows sharing in a natural way. Operations on one or more such objects take place as transactions. When a transaction accesses database storage it implicitly acquires a read or write lock on the storage, as required. If the lock conflicts with those held by other transactions, the transaction is made to wait. Eventually the transaction finishes and it completes by calling either commit or undo. In the former case, the transaction's updates are made permanent, by writing them to secondary storage, while in the latter case they are discarded. In either case, the locks are freed and any processes waiting on them are allowed to continue.

Unlike database storage, however, recoverable shared virtual storage (RSVS) is designed for storing computational data which is not needed if the entire cluster crashes. Rather, the data is built up as the system begins and continues operation.

Recoverable shared virtual storage (RSVS) is designed for storing computational data which is not needed if the entire cluster crashes. Thus, when the changes are made visible, they are not written to secondary storage as are changes to the database storage. So long as at least two copies of the page exist in different processors in the cluster, the page of data is recoverable.

The co-pending application also discloses an implementation based on file structures i.e., structures which are written to secondary storage when the transaction is committed. It does not address the manner in which recoverable shared virtual storage (RSVS) may be applied to insure the recoverability of "shared data structures" in the event of a partial failure or for data structures that are not written to secondary storage.

Shared data structures include data structures for interprocess communication ("IPC") mechanisms, such as message queues, semaphores, and shared memory segments, as well as file system data structures such as the in-core inode table, the open file table, the directory cache (for both local and remote directories); and subsystem global data, such as the SNA connection table.

Message queues provide a useful mechanism for interprocess communication in operating systems based on or derived from the UNIX[2] operating system, such as the IBM AIX TM operating system. Processes can communicate by first creating a message queue, then exchanging messages via the queue. A set of system calls is provided to use this mechanism.

[2]UNIX is a registered trademark of AT&T Bell Laboratories.

Recent prior art developments relating to message queue implementation have taken different approaches. UNIX development has centered primarily on work done by AT&T, called "System V" and by the University of California at Berkeley, called "Berkeley". Both of these versions have had a form of interprocess communication integrated into them. Berkeley provides two versions of IPC called "data-grams" and "virtual circuits", both of which are built on the concept of a "socket." According to B. D. Fleisch in his article entitled "Distributed System V IPC in LOCUS: A Design and Implementation Retrospective" published in the *Communications of the ACM* in February 1986, "Berkeley's IPC is best suited for 'long-haul' environments". On the other hand, "System V" IPC is built for a single system image of computation. More particularly, Fleisch's article describes the distribution of System V IPC. In the LOCUS system it is possible, for example, to share a message queue between processes running on different processors; if, however, one of the processors crashes, the messages in the queue on that processor are lost, although the identity of the queue is not. Thus, the existence of the distributed system becomes visible to the surviving processes in the event of a partial failure. In order to keep the message queues recoverable in the face of failure, the LOCUS system takes special steps. A queue is referred to by a unique "handle". The handle's value includes identifiers and "boot counts", or the number of times the system has been started, which are checked whenever the handle is used. The "name server", which allocates and assigns handles, must always be available, so there is a mechanism in the operating system kernel to start a second one if the first fails.

The name server and the kernels have to communicate, which is done through a distinguished queue. Messages go from the kernel to the name server using the normal mechanisms; replies from the name server are intercepted by the kernel which recognizes the distinguished queue's handle and routes the reply from the name server's machine to the one where its client resides. When the processor unit containing the name server crashes, a new name server processor unit is elected. Parts of the name server's database have been replicated at each processor unit within the cluster, and the new name server can rebuild the entire database, and reconstruct what was at the failed processor unit, by polling the surviving processor units. This is a fairly complicated and lengthy procedure. It should also be noted that only the queues that had existed at the failed processor unit are lost.

Although the above-referenced mechanisms may be effective for providing some level of reliability, a system with substantially higher reliability is desirable, especially a system which does not require a set of complex special-purpose mechanisms to provide higher reliability. Therefore, it is desirable to develop a mechanism for implementing shared data structures, such as message queues, which retains not only the existence of the data structures in the event of a processor failure, but also saves any data within the data structures at the time of failure. In particular, it is desirable to implement a form of highly reliable data structures by adapting the concept of recoverable shared virtual storage (RSVS) to the implementation of message queues and other shared data structures. Thus, it would not be necessary to implement special mechanisms for individual data structures to achieve higher reliability.

SUMMARY OF THE INVENTION

The present invention provides for a system for and a method of ensuring the reliability of system-wide shared data structures, such as message queues, in closely-coupled, multi-processor, recoverable shared virtual storage (RSVS) data processing systems, wherein each of the plurality of processors share virtual storage and can access each one of a plurality of virtual storage segments by the same virtual storage address. The system keeps at least two copies of each page on different processors which are updated only after the completion of a transaction which may modify such a page. The copies are, in effect, updated simultaneously in such systems, one processor is designated as the lead processor for a given data structure and another processor is designated as the back-up processor for such a data structure.

The system includes an identification table stored in a virtual storage segment owned by the lead processor. This table contains information for locating any one of a plurality of shared data structures, such as message queues, wherein the recoverable shared virtual storage layer of the operating system designates another processor to be a back-up processor for the lead processor. A consistent copy of the modified shared data structure table is stored in the back-up processor and is updated automatically upon the completion of a transaction, i.e. when the transaction is committed.

In response to a system call initiated by a process at any one of the plurality of processors in the system, the operating system in that processor initiates a transaction on a shared data structure, such as a message queue, which may include creating a new message queue owned by the requesting processor, sending a message from a process to a message queue in a virtual storage segment owned by the same or another processor, receiving a message from a message queue in a virtual storage segment owned by the same or another processor or removing an existing message queue. Upon completion of the transaction, the processor issuing the system call calls commit whereupon the modifications to the data structure are committed and copies of such data structure are stored in the processor owning the data structure and in its back-up processor. Upon commit, the RSVS layer of the operating system also updates the identifying information in the table stored in the virtual storage segment owned by the lead processor and a copy of such table is stored in a back-up processor to the lead processor.

BRIEF DESCRIPTION OF THE DRAWINGS

FIG. 3A shows the format of the message queue information table (MSGQIT).

FIG. 3B shows the format of the control information which controls access to the MSGQIT.

FIG. 3C shows the format of an entry in the message queue information table (MSGQIT).

FIG. 3D shows the MSGQHDR segments which contain message queue headers.

FIG. 5 contains a flow chart that describes the steps that are performed by the operating system to create the message queue information table.

FIGS. 6A and 6B contain a flow chart that describes the steps that are performed by a recoverable shared virtual storage system executing on a given processing unit when a "MSGGET" system call is issued. The MSGGET system call may be used to create or get access to a message queue.

FIGS. 7A and 7B contain a flow chart that describes the steps that are performed by a recoverable shared virtual memory system executing on a given processing unit when a "MSGCTL" system call is issued. The MSGCTL system call may be used to query the status of a message queue, change its access permissions, or destroy it.

DESCRIPTION OF THE PREFERRED EMBODIMENT

Figure 1:
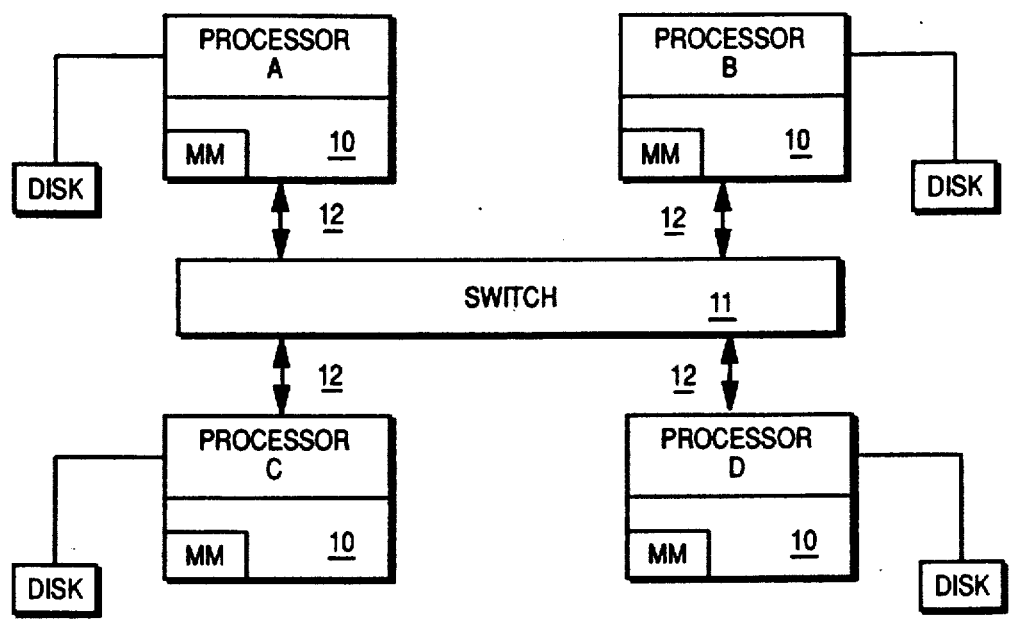
FIG. 1 is a functional block diagram of a plurality of processor units interconnected in a cluster configuration, in which the method of the present invention may be advantageously employed.

FIG. 1 is a block diagram of a multi-processor data processing system configured in a cluster, in which the method of the present invention may be advantageously employed. As shown in FIG. 1, the data processing system comprises a plurality of processor units 10, a switch 11 and a plurality of communication links 12, each of which connects one processor unit 10 to switch 11. The function of switch 11 is to permit any processor unit 10 to communicate with any other processor unit. The specific details of the switch and the communication links are not considered relevant to an understanding of the present invention and hence are neither shown nor described in detail. Examples of the switching arrangement that may be employed may be found in U.S. Pat. Nos. 4,635,250; 4,633,394; and 4,605,928.

Figure 2:
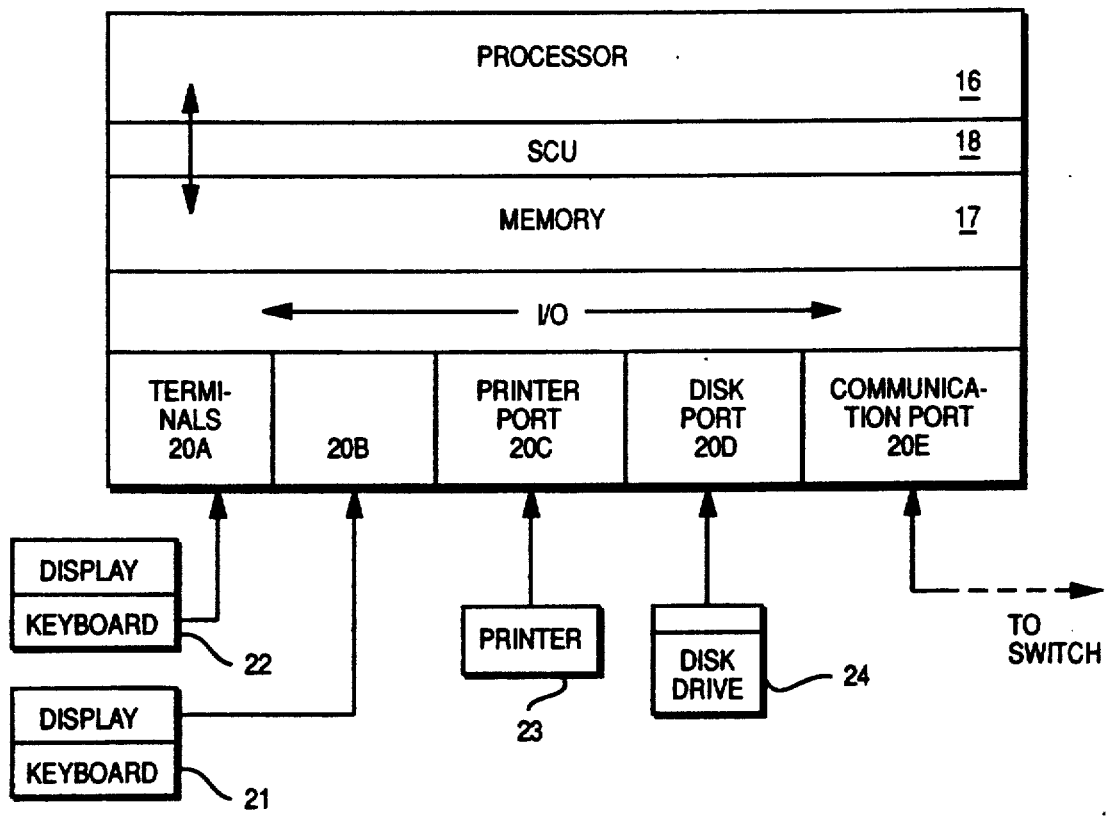
FIG. 2 is a block diagram of one of the processor units shown in FIG. 1, illustrating the various functions that are incorporated in one of the units.

FIG. 2 illustrates in detail one of the processor units shown in FIG. 1. Processor unit 10 may be a high function personal computer or an engineering work station having the 801 architecture and running the IBM AIX TM operating system such as the IBM RT system. It should be noted, however, that other architectures and operating systems may be employed in practicing the invention.

The processor unit 10, as shown in FIG. 2, comprises a processor 16, a main storage 17, a storage control unit 18 which controls the transfer of data between the processor 16 and main storage 17, and a plurality of I/O adapters or ports 20A-20E. Ports 20A and 20B function to connect display-type terminals 21 and 22 to the system. Port 20C connects a printer 23 to the system while port 20D connects a disk drive 24 to the system. The communication port 20E is employed to connect the processor unit 10 to the communication link 12.

For purposes of discussion, processor unit 10 corresponds generally to the virtual storage data processing system that is described in detail in cross-referenced U.S. patent application Ser. No. 06/819,458, which is incorporated herein by reference. As described in that application, the processor has a 32 bit effective address that is converted into a 40 bit virtual address by employing the 4 high order bits (31-28) to select one of 16 segment registers, each of which stores a 12 bit virtual storage segment address that defines one of 4096 unique virtual storage segments. Each virtual storage segment comprises 256 megabytes of virtual storage ($2^{**}28$). If a page includes 2K of data, then a virtual storage segment contains 128K pages. On the other hand, if a page includes 4K bytes of data, the virtual storage segment then has 64K pages, or more precisely, 64K virtual page addresses which may be used to identify pages of data that are currently assigned to that virtual storage segment.

As explained in the cross referenced application, an IBM AIX TM operating system is employed for the processor unit so that application programs and data employed by these programs are organized in accordance with the AIX TM file system type of organization.

It should be assumed that in the following discussion, a page of data comprises $2^{}12$ or 4K bytes (4096) and that a virtual storage segment consists of $2^{}16$ or 64K pages.

Specialized communications protocols such as the IMCS protocol disclosed in the co-pending U.S. application Ser. No. 07/298,398 now abandoned filed concurrently herewith in the name of Blount, et al, and which is incorporated herein by reference, have been developed to make the intermachine communication efficient, and there are pager protocols to ensure virtual storage coherency across the cluster.

Preferably, the 801 Storage Control Unit (SCU) 18 provides a form of hardware assistance for physical locking. Each 4Kbyte page is divided into 32 lines of 128 bytes each. When a process first attempts to reference a line, the SCU 18 interrupts the processor 16. This interrupt, called a "lock fault," is used by the AIX TM operating system to invoke locking an journaling functions without explicit interaction on the part of the process.

Although lock faults occur on a line basis, a processor 16 acquires the right to grant read or write locks in an entire page. Once a processor 16 has acquired this right, individual processes executing on that processor 16 acquire locks on a line level from the lock manager located at that processor. When a transaction commits its updates, all previous copies of affected pages are invalidated in other processors 16. Subsequent page faults may bring in the updated copies to the storage of the other processors.

Although recoverability as described earlier may be desirable for all cluster storage segments, not all of them require database semantics and hence locking. For example, access to the control structure which describes a given message queue is synchronized by making the access via transactions which use locking and logging, but the messages themselves do not need locking control, though the data does need to be recoverable.

It is important to note that implementation as of RSVS or cluster storage may be made on architectures other than the 801. In fact, any general purpose computing hardware may be used. Some form of locking (either hardware or software) is useful, although not essential, for ensuring consistency. For example, cluster storage could be implemented on an optimistic concurrency control mechanism such as described in Kung H. T., and Robinson, J. T. On Optimistic Methods For Concurrency Control; *ACM Transactions on Database Systems* 6(2) (June 1981). Some way to detect when updates have been made is also useful. Such a detection system might be based on a hardware-assisted storage protection mechanism, or perhaps by funneling all updates through special subroutines, as opposed to load and store instructions, and recording which updates were made when and by which processes. The 801 architecture provides suitable hardware-assisted storage protection mechanism to implement the system-wide locking and logging facilities.

In order to describe how recoverable shared virtual storage (RSVS) can be used to maintain the availability of shared data structures in a multiprocessor, cluster-type processing system, it is helpful to explain the implementation of one type of shared cluster data structure, message queues.

In an AIX TM operating system, four basic system calls are used to create and use message queues: MSGGET, MSGCTL, MSGSND and MSGRCV. The calls are used to accomplish the following transactions:

| | |
|---|---|
| MSGGET | create a queue |
| | return a message queue id (MSGQID) for an existing queue |
| MSGCTL | queries a queue's status |
| | changes a queue's permissions |
| | deletes a queue |
| MSGSND | puts a message in a queue |
| MSGRCV | removes a message from a queue |

In implementing message queues with RSVS, we depend on the RSVS properties set forth in co-pending U.S. patent application Ser. No. 07/126,820 which is incorporated herein by reference; specifically, it is assumed that the contents of an RSVS segment survive non-fatal cluster failures such as that of a single processor. It is also assumed that any process in the cluster with the proper permission to do so can attach to a given RSVS segment. If the accessed data is not in the storage of the processor where the process is executing, all the messages exchanged between kernels to transfer the required page(s) to the memory of that processor are implemented at the RSVS layer of the kernel. Also, when a transaction is completed, it is assumed that the RSVS layer of the operating system updates the backup copies for all pages modified during the transaction.

FIG. 5 is a flow chart illustrating how a message queue information table (MSGQIT) shown in FIG. 3A is created upon system start-up. The MSGQIT includes control information which controls access to the MSGQIT as well as MSGQIT entries for each message queue. The format of the control information, which is shown in FIG. 3B, includes a "lock word" and the number of stored MSG queues identified in the MSGQIT. The format for each entry in the MSGQIT is shown in FIG. 3C.

In step 26 (FIG. 5), during cluster startup, i.e., initial program loading or "IPL", the first processor in the system which is started-up creates an RSVS segment for storing identifiers for shared data structures for locating data.

In step 28, the operating system of the lead processor, unit 10A for example, designates an RSVS segment id for the MSGQIT. The RSVS segment id of the MSGQIT table can either be pre-defined or retrieved from a file in the file system. There are several such global system ids that may be kept in one system file. The owner of the RSVS segment is the cluster leader and a back-up processor, unit 10B for example, is assigned to this lead processor 10A.

In step 30, after locking the MSGQIT segment, the MSGQIT is formatted to contain all empty entries. The format of an entry in the MSGQIT is shown in FIG. 3C. The USECOUNT count field of each entry is set to "0". The maximum number of queues is filled in. This is a system parameter specified by the system administrator.

In step 32, the operating system in 10A issues "COMMIT". The RSVS layer makes copies of all the pages changed by step 30 in back-up processor 10B, and frees all the locks that were acquired. The message queue system is now ready for operation.

As in previous versions of the AIX operating system, four basic system calls allow the creation and use of message queues in recoverable shared virtual memory systems-MSGGET, MSGCTL, MSGSND, and MSGRCV. The message queues themselves are preferably placed in other RSVS segments different from the one containing the MSGQIT.

Figure 3E:
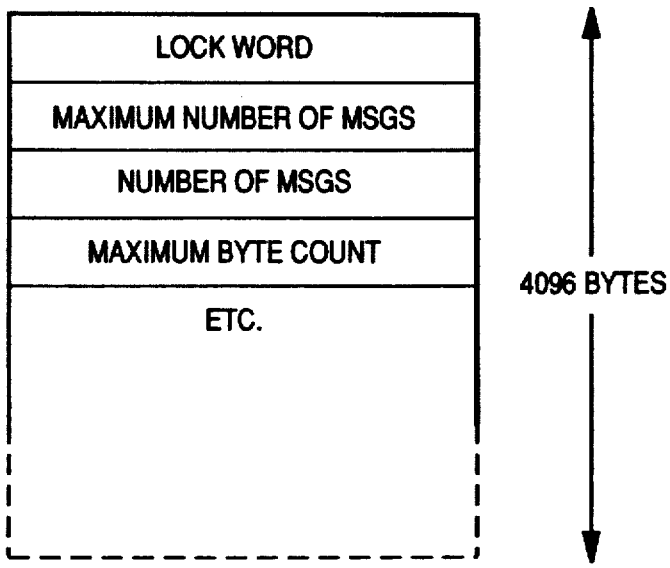
FIG. 3E shows the format of a message queue header entry.
Figure 3F:
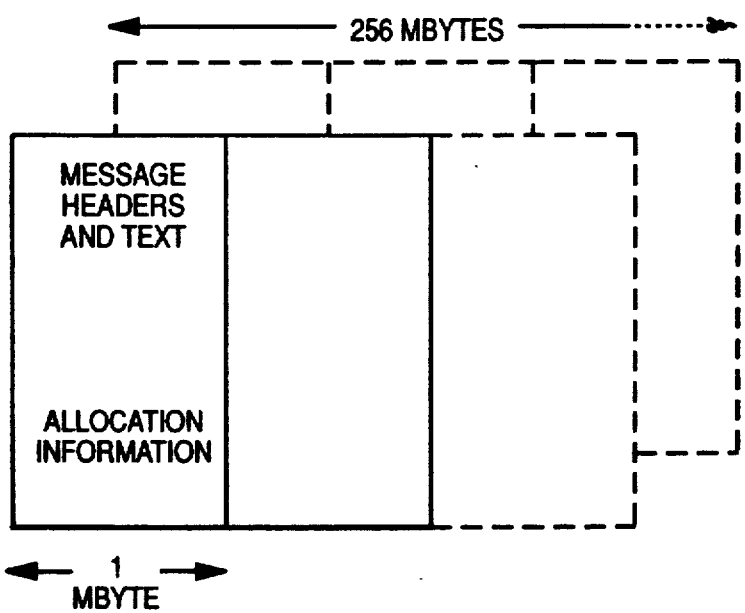
FIG. 3F shows the MSGTXT segments which contain message text; there is a one for one correspondence between a MSGQHDR, segment and its MSGTXT segment, and between the entries in each.

When a new message queue is created, its header is placed in a segment created by the kernel of the processor where the process that created it is located. This is the MSGQ header segment or MSGQHDR segment illustrated in FIG. 3D. The entries in the MSGQHDR segment are shown in FIG. 3E. In addition, the text of each message stored in a message queue is placed in another segment called the MSGTXT segment shown in FIG. 3F.

Figure 6A:
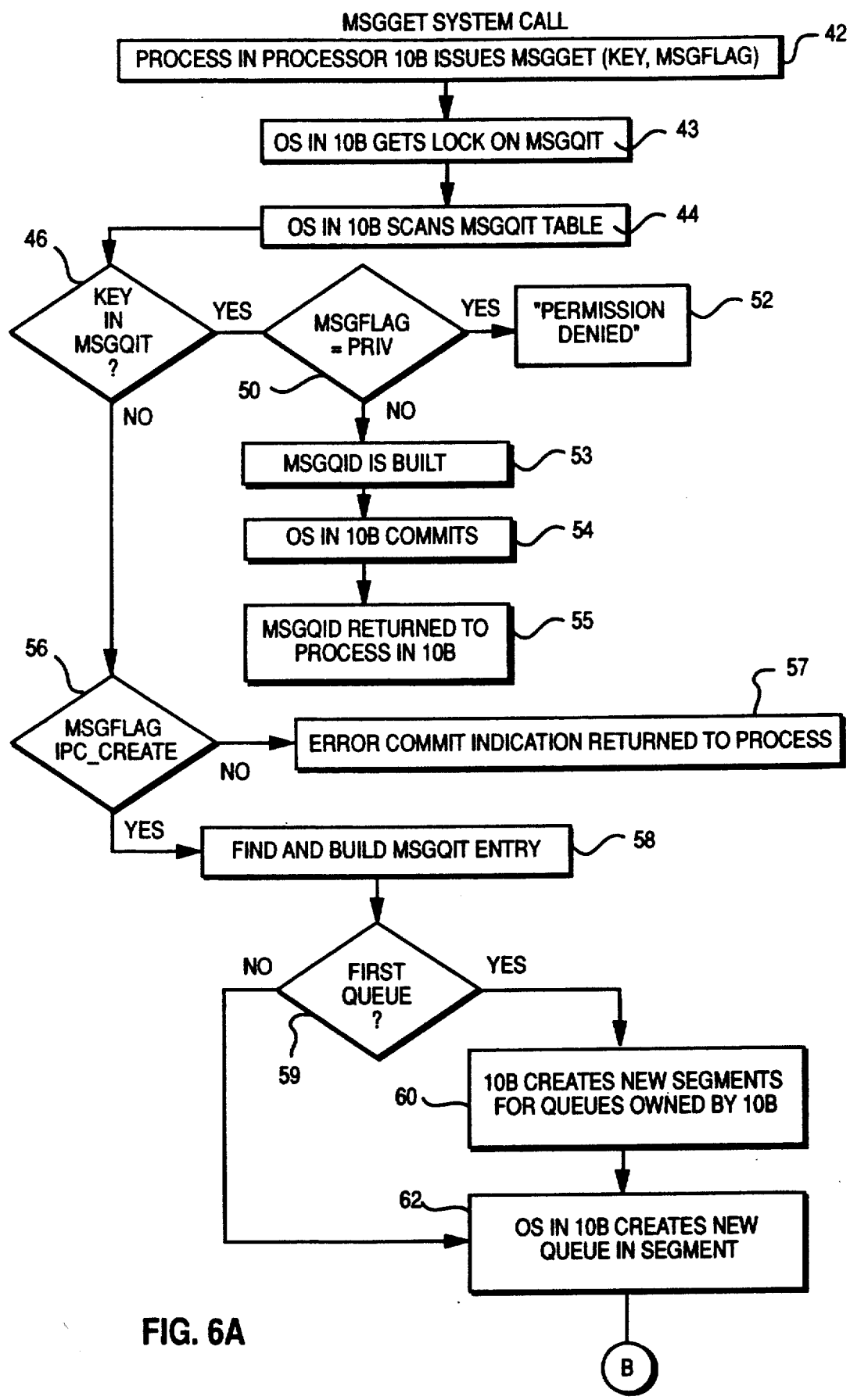

FIGS. 6A and 6B are flow charts that illustrate the steps that are performed by an operating system in carrying out the MSGGET system call.

The MSGGET system call is used to retrieve the message queue identifier (MSGQID) of an existing queue or create a new queue. It has the following syntax:

MSGQID=MSGGET(KEY,MSGFLAG)

Considering the steps of the RSVS implementation of the MSGGET system call of the present invention in more detail, in step 42 of FIG. 6A, a process executing on processing unit 10B, for example, issues a MSGGET system call.

In step 43, the operating system of processor unit 10B locks the MSGQIT by writing into the "lock word" of the control information line of the MSGQIT segment shown in FIG. 3B. If another process anywhere in the cluster already has the lock, this process waits and is started later by RSVS. This "global lock" on the entire MSGQIT is in addition to the line locks normally acquired during access to cluster storage. The purpose of this global lock is to avoid a deadlock which could occur, in the absence of a global lock, if two processes in different processors each attempt to write into an unused or "free" entry in the MSGQIT.

In step 44, the operating system of processor unit 10B scans the MSGQIT. As the MSGQIT is scanned, the RSVS layer of the kernel of the unit's operating system acquires read locks on those pages of the MSGQIT segment that are referenced.

Figure 4:
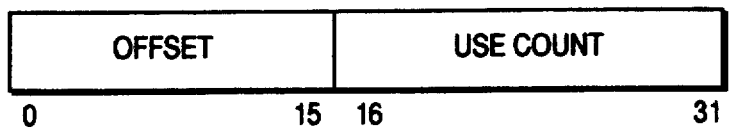
FIG. 4 shows the format of the message queue identifier (MSGQID).

In step 46, the operating system of unit 10B determines if the key has been found in the MSGQIT. If the key is found, processor 10B performs step 50. In step 50, the operating system of unit 10B determines if the PRIVATE bit in MSGFLAG is set. If it is, in step 52 the operating system of unit 10B calls "COMMIT" to free the locks and returns a PERMISSION DENIED error indication to the process. If the PRIVATE bit in MSGFLAG is not set, the transaction continues. The MSGQID is built by combining the offset of the MSGQIT entry for a message queue in the MSGQIT array and the USECOUNT in the entry in step 53. The format of the MSGQID is illustrated in FIG. 4.

In step 54, the operating system in processor 10B calls COMMIT, which frees the locks acquired on the lock word and the MSGQIT entries which were read.

In step 55, the MSGQID is returned to the caller of MSGGET.

In step 56, if no matching key entry is found, the operating system of unit 10B determines if the CREATE bit in MSGFLAG is set.

In step 57, if the CREATE bit is not set, the operating system of unit 10B calls COMMIT to free the locks and returns an error indication to the process. If the CREATE bit is set, a new message queue is to be created by the operating system of unit 10B. The new queue will be owned by unit 10B since it is the processor that executed the system call. This means that its header and data will be placed in segments owned by 10B.

FIG. 3C shows the layout of an entry in the MSGQIT array. In step 58, an unused entry is found one with the free/used flag set to "free" and the flag is set to "used". The USECOUNT field is incremented by 1. This is to prevent a previous user of the entry from accessing the queue. The value of "key" is placed in the entry.

In step 59, the operating system of unit 10B determines if the queue created is the first queue owned by unit 10B. If there are no other queues owned by unit 10B, or if the maximum number of queues (256) which can exist in the same memory segment has already been reached, the operating system of unit 10B in step 60 creates two new RSVS segments, one to hold queue headers (MSGQHDR segment) and one to hold message text (MSGTXT segment). An allocation table for the 256 entries in these segments is built in the memory of processor 10B. If processor 10B crashes, the allocation information can be rebuilt from data in the MSGQIT entries. 10B is the owning site of the new segments; a back-up site, for example unit 10A, is chosen.

In step 62, the operating system in unit 10B allocates and builds a queue header in the new or existing MSGQHDR segment, and initializes the corresponding text area in the MSGTXT segment. The current process is the only one performing these operations in the cluster, since it still holds the global write lock on the MSGQIT segment.

The MSGTXT segment is divided into one 1MByte area per queue—256 queues share this segment. The details of how the space in the text area is allocated to messages and managed is known to a skilled person in the art. As will be seen later, each text area is only accessed by one processor at a time, so there is no need for further locking mechanisms.

In step 68, the kernel of unit 10B updates the MSGQIT. It fills in the ids for the MSGQHDR and MSGTXT segments, and the page number attached to the queue header. In step 70, the operating system of unit 10B issues a "COMMIT" call to update both copies of pages changed in the RSVS segments. The COMMIT call also causes all locks held by the process on the message queue data structures to be released. In step 72, the MSGQID is built as described in step 53 and returned to the process which requested it.

In summary, the user specifies a key to identify the message queue of interest. The system scans the table in the MSGQIT segment. If there is an existing queue associated with the key, its MSGQID is returned; otherwise, if the create bit in FLAG is set, then a new queue is created, and its MSGQID is returned to the calling process. When a new message queue is created, information about it is placed in an RSVS segment owned by the kernel of the processing unit where MSGGET is called, i.e., the MSGQHDR segment.

If processor 10B crashes during the execution of the MSGGET call, all changes it made to the three RSVS segments are lost, which is desirable, since the MSGGET call did not complete. The RSVS layer has backup copies of the unchanged versions of the pages which the MSGGET call had changed on processor 10B, and it frees the locks held by processor 10B. Other MSGGET calls in the surviving processors can then run and not see inconsistent data.

If processor 10B crashes after the execution of the MSGGET call, there are copies of all the updated data structures in the surviving processors, so the newly created message queue is not lost.

A message queue consists of a header area and a message area. The header area includes queue status information such as: process ids for the queue creator, the queue owner, the last process to access the queue, the time stamp of the last update to the queue and the access permission for the queue, including those of the owner, the group, and all others. The header also includes a number indicating the maximum number of bytes allowed in the queue at any time, and the pointers to the first and last messages currently in the queue.

When a new message queue is created, its header starts on a page boundary. This improves performance when different queues represented in the same segment are simultaneously accessed by processes executing on different processors, since RSVS allows only one process to write into a page at any time, and since access to a message queue results in an update to the status information in the queue header.

The messages themselves are placed in a third RSVS segment called the message text segment (MSGTXT). Messages are formatted as:

<message_header,text> pairs. The message header is a fixed length data structure which contains the following fields: message type, the number of bytes in the message, and a pointer to the next message header (if any) in the queue. The type prefix allows processes to select messages of a particular type. Processes can then extract messages from the queue in an order other than the order they arrived on the queue.

The MSGCTL system call is used to perform a variety of control operations on a message queue. The control operations include: querying status information on the queue, changing access permissions to the queue, and deleting a message queue from the system. MSGCTL takes the following form:

MSGCTL (MSGQID,CMD,BUF)

where CMD indicates the action to be performed by MSGCTL.

Figure 7A:
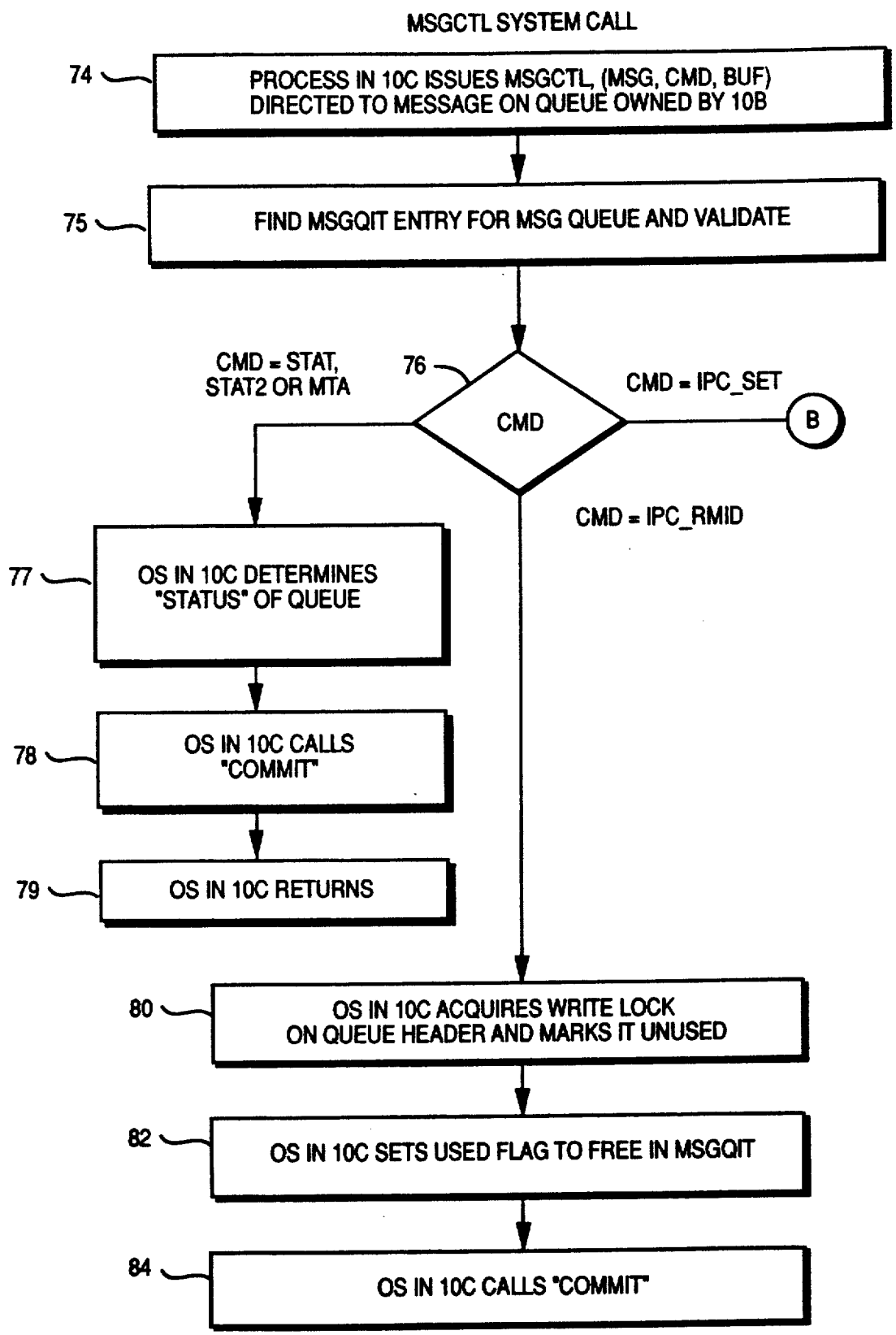

FIGS. 7A and 7B together comprise a flow chart that illustrates the steps that are performed by an operating system in carrying out the MSGCTL system call. In step 74 (FIG. 7A), a process in a processor unit, processor 10C for example, issues a MSGCTL system call directed to a queue owned by processor 10B.

In step 75, the operating system in processor 10C reads the MSGQIT entry specified in the OFFSET field of MSGQID and validates that the USECOUNT fields in the MSGQIT entry and the MSGQID match. If not, the queue identified by MSGQID no longer exists; COMMIT is called to free the lock acquired on the MSGQIT entry and an error indication is returned to the caller.

In step 76, the operating system of processor unit 10C reads CMD to determine the action to be performed by MSGCTL.

In step 77, if CMD =STAT, STAT2 or MTA, a group of status commands, the operating system of processor 10C reads the queue header found through MSGQHDR segment id and page number in the MSGQIT entry. If another process is changing this header, the calling process has to wait to get the read lock. When it gets the read lock, it sees a consistent view of the header, i.e., no information in it is being changed. The operating system in 10C copies the requested information from the header into BUF.

In step 78, the operating system in unit 10C calls "COMMIT", which causes the read locks acquired by unit 10C in steps 75 and 77 to be released. In step 79, the operating system in unit 10C returns.

In step 80, if CMD equals IPC_RMID, a command to destroy a queue, the operating system in processor 10C obtains a write lock on the queue header found in step 75 by writing into its lock word. It validates that the calling process has permission to delete the queue and marks the queue header as unused. Occasionally, a process in processor 10B reads all the queue headers in its MSGHDR segment(s), and updates the allocation tables for headers freed in other processors. In step 82, the operating system in unit 10C deletes the queue by setting the flag in the MSGQIT entry found in step 75 to "free". Note that this operation does not require the lock on the MSGQIT segment. Calling COMMIT in step 84 causes the write locks acquired by unit 10C in steps 78 and 80 to be released.

Returning to step 76 of the MSGCTL transaction shown in FIG. 7A, if the command is IPC_SET, which updates the set of access permissions for a queue, the operating system of processor 10C, in step 86, acquires a write lock on the queue header to be updated in the MSQGHDR segment owned by processor 10B as in step 78.

In step 88, the operating system in processor 10C updates the access permission information in the message queue header.

In step 90, the operating system of unit 10C calls "COMMIT". As described above, the COMMIT operation automatically updates both real copies of the page containing the queue header and frees the locks acquired in steps 75 and 86.

MSGSND and MSGRCV are used to exchange messages via a message queue. The MSGSND system call is used to send a message, i.e., place it in the message queue:

MSGSND (MSGQID,MSGP,SIZE,MSGFLAG)

The MSGRCV system call receives a message, i.e., takes if off the queue:

MSGRCV
(MSGQID,MSGP,SIZE,TYPE,MSGFLAG)

where MSGQID is the message queue identifier; MSGP is a pointer to the data structure containing the message text in the case of MSGSND, or indicating where the text is to be stored for MSGRCV; SIZE is the message size; and MSGFLAG is a flag that defines the actions to be taken if the system call cannot complete.

Figure 8A:
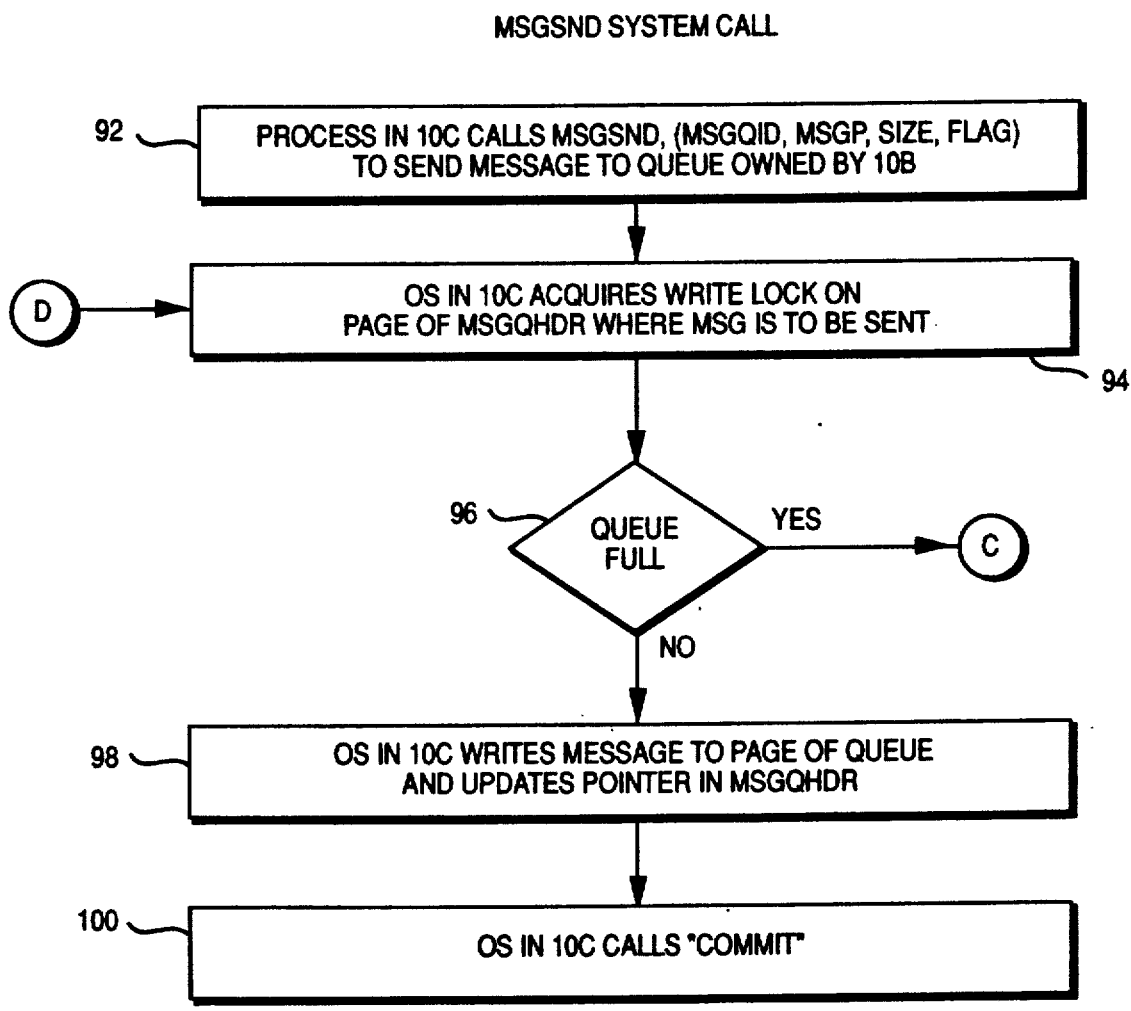
FIGS. 8A and 8B contain a flow diagram that describes the steps that are performed by a recoverable shared virtual memory system executing on a given processing unit when a "MSGSND" system call is issued. The MSGSND system call may be used to put a message in a message queue.

In step 92 (FIG. 8A), an RSVS transaction is initiated when the operating system in a processing unit, unit 10C for example, issues a MSGSND system call to send a message to a message queue owned by the same or a different processor, unit 10B, for example. In step 94, the operating system of unit 10C finds and locks the queue header as described in steps 75 and 78.

In step 96, the operating system of unit 10C determines whether the message queue is full. If it is not full, in step 98, the operating system of unit 10C copies the message text to the MSGTXT segment, updates the header in the text segment and updates the queue header in the MSGQHDR segment.

In step 100, the operating system of unit 10C calls "COMMIT". This backs up the changes made to the MSQGHDR and MSGTXT segments and frees the locks acquired in step 94. Note that step 98 does not acquire locks in the MSGTXT segment since synchronization is done through the lock word in the queue header. However, logging is done on the MSGTXT segment so that changes are backed up.

Figure 8B:
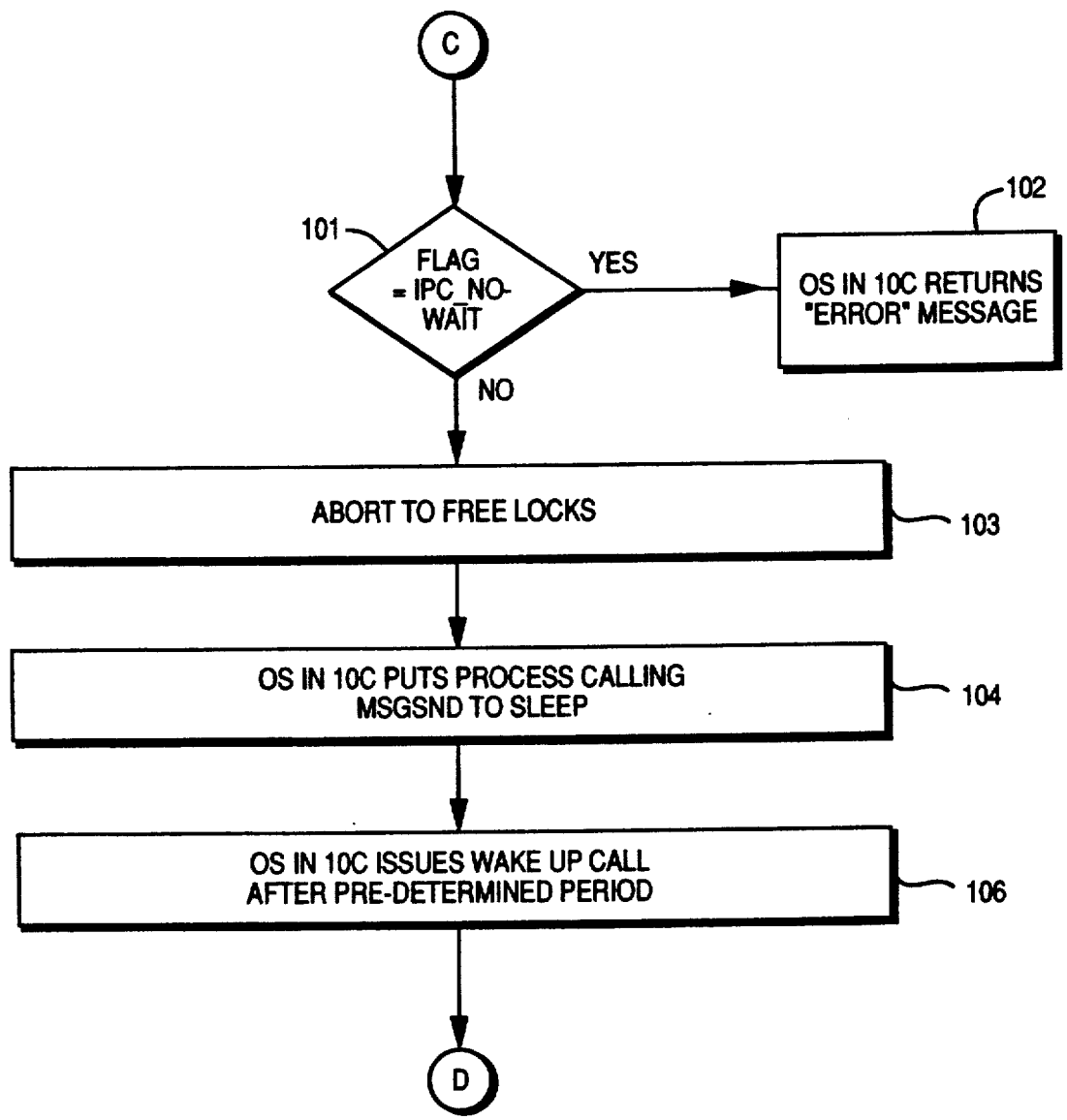

If the operating .system of processor 10C determines that the message queue is full in step 96, in step 101, (FIG. 8B) the operating system of unit 10C determines whether the IPC_NOWAIT bit of MSGFLAG is set. If it is set to IPC_NOWAIT, the operating system of unit 10C calls COMMIT and returns an error message to the process in step 102. If the IPC NOWAIT bit is not set, the transaction is continued.

In step 103, .the operating system calls "abort" to free the locks acquired on the MSGQIT entry and the queue header. If this were not done, no other process could access the queue, including for example a process which would take a message out of the queue and make it not full.

In step 104, the operating system in unit 10C puts the process in unit 10C issuing the MSGSND system call "to sleep" for a predetermined period of time. In the preferred embodiment, the operating system of unit 10C is programmed, in step 106, to periodically "wake-up" and retry the MSGSND system call from the beginning. This sleep and wake-up process occurs continually until the queue is no longer full.

Several alternative approaches are possible for effecting the intracluster wakeup in addition to the simple one of waking-up periodically and retrying. For example, a processor unit removing a message from a message queue might signal all other processors in the cluster that a message has been removed from the message queue. Upon receipt of such a signal, a processor might then wakeup all of its processes that are sleeping because the message queue is full and because these processes intend to place a message on the queue. In theory, this type of mechanism may be more efficient than polling; however, implementing an efficient mechanism of this type that can recover from partial failure is substantially more difficult.

The periodical wake-up approach has the advantage, however, of being "fault tolerant" in the sense that if an "unblocking event", i.e. removing a message from the queue, occurs in a processor that crashes before it can send out a wake-up signal, every sleeping process will still find out about it eventually.

If a message queue is removed from the system while a process is sleeping while waiting for an unblocking event to occur, the call within which the process is sleeping will fail in step 75 when the process wakes-up. Since a MSGQID contains a use-count, another queue with the same MSGQID cannot be created in the meantime.

The MSGRCV operation is similar in most respects to the MSGSND operation. The queue header and message text are found as for MSGSND—if the queue does not have a message, or one of the right type, the call may abort and wait. The text is copied from the MSGTXT segment to the user's buffer and the message header and queue header are updated. COMMIT is then called.

In summary, a process performing some operation on a message queue-placing a message on the queue, for example,—runs a simple transaction against the recoverable shared virtual storage segment containing the message queue. All the information pertaining to such message queues is represented in three cluster-wide RSVS segments. The transaction is run at the processor unit on which the process that wants the operation executed is located, thereby hiding the fact that the transaction is running in a cluster. Only upon completion of the transaction is the new state of the message queue system committed to storage in a virtual storage segment owned by the processor and in a copy of the virtual storage segment in its back-up processor.

If two processors communicating via a message queue are in different processors, 10A and 10C for example, they are not aware of that. Their MSGSND and MSGRCV calls operate locally, and the RSVS layer takes care of any kernel level communication required. If on another occasion the two processes were to execute on one processor, unit 10B for example, they would not have to be changed in any way and would execute as before.

Furthermore, when running in two processors, unit 10A and 10C, if one of the processors, unit 10A for example, were to crash, the surviving process in unit 10C would be able to receive all the messages sent by the process in unit 10A before the crash, and would not receive a partial message which was being sent by unit 10A at the time of the crash.

This implementation proposes laying out data structures for different queues on line and page boundaries. This is to prevent interference between calls for different queues, and this technique reduces the amount of paging and locking traffic in the RSVS layer. It does use more virtual storage than a more compact organization would, but this appears to be a reasonable tradeoff.

The above description for the implementation for one type of shared data structure, message queues, based upon recoverable shared virtual storage (RSVS), provides significant advantages over an implementation relying on explicit message passing among communicating processes wherein the transaction is not executed by the calling processor, but is sent to the processor containing the message queue, where it is then executed, and the results sent back to the originating processor. The recoverable shared virtual storage (RSVS) implementation of message queues is enhanced through the use of the intermachine communication systems described in the co-pending patent application Ser. No. 07/298,398. This results in all message passing being contained in a very small portion of the operating system; thus, the rest of the operating system can be implemented nearly as simply as an operating system for a uniprocessor.

The present invention also eliminates the need for a "two-phase commit" for implementing operations on message queues and for implementing other system services. Thus, system services can be implemented with less work, executed more efficiently, and can be modified and maintained for lower cost than if they were implemented via explicit "message passing". Moreover, implementing system services in this manner radically simplifies the implementation of system services. Maintaining and adding functions to the operating system are also simplified.

Although the description has shown how recoverable shared virtual storage may be used to make AIX TM message queues reliable in a cluster of multiprocessors, i.e. to make the queues and the messages they contain persist even if a single processor in the cluster fails, it will be apparent to those skilled in the art that other system facilities and shared data structures can be made reliable and that various other modifications may be made to the present invention without departing from the spirit of the invention and the scope of the appended claims.

We claim:

1. A data processing system having a plurality of processors interconnected by a communications link, comprising:

virtual storage shareable during operation of said system by each of said plurality of processors, said virtual storage having a plurality of virtual storage segments, each accessible during operation of said system by a same virtual address from any one of said processors;

means for keeping at least two copies of a virtual page, wherein each of said copies is stored in a different processor;

means for automatically updating each of said copies for each of said pages when modified by a completed transaction;

a message queue table stored in a virtual storage segment, having information about a plurality of message queues in the system; and means for placing a message queue created by a process in a first processor into a virtual storage segment crated by said first processor.

2. The system of claim 1, wherein the message queue table further comprises:

means for identifying the virtual storage segment containing the message queue; and means for identifying the message queue in said identified virtual storage segment.

3. A system for insuring reliability of system-wide data structures in a data processing system having a plurality of processors interconnected by a communications link, comprising:

means for sharing virtual storage by each of the plurality of processors during operation of said system;

means for accessing each one of a plurality of virtual storage segments of said virtual storage by a same virtual address from any one of said processors during operation of said system;

means for keeping at least two copies of a virtual page, wherein each of said copies is stored in a different processor;

means for updating each of said copies for each of said pages when modified by a completed transaction;

a message queue table stored in a first virtual storage segment having information about a plurality of message queues in the data processing system;

means for issuing a message get system call from a process in any one of said plurality of processors;

means for scanning the message queue table for an entry for said called message queue;

means for creating a new message queue in a second virtual storage is no entry is found;

means for designating ownership of the new message queue by the processor of the process issuing the message get system call; and means for adding an entry to said message table for said new message queue.

4. The system of claim 3, further comprising:

means for obtaining a global lock on said table upon the issuance of said message get system call.

5. The system of claim 3, wherein:

the processor having the process which originated the message get call directs said updating means to automatically update the copies of the pages containing the message queue table and copies of the pages containing the message queue.

6. The system of claim 3, wherein:

means for returning the identification of the created message queue to the process which issued the message get system call after the copies of the pages containing the message and message queue table are updated.

7. A system for insuring reliability of system-wide data structures in a data processing system having a plurality of processors interconnected by a communications link, comprising:

means for sharing virtual storage by each of said plurality of processors during operation of said system;

means for accessing each one of a plurality of virtual storage segments of said virtual storage by a same virtual address from any one of said processors during operation of said system;

means for keeping at least two copies of a virtual page, wherein each of said copies is stored in a different processor;

means for updating each of said copies for each of said pages when modified by a completed transaction;

a message table stored in a first virtual storage segment having information about a plurality of message queues in the data processing system;

means for issuing a message control system call from a process in any one of said plurality of processors to remove a message queue;

means for deleting the message queue from a second virtual storage segment containing the queue; and means for deleting the entry for fhe deleted queue in the message table stored int eh first virtual storage segment.

8. The system of claim 7, wherein:

the processor originating the message control system call directs the updating means to update the pages containing both copies of the message queue and the message queue table.

9. A system for insuring reliability of system-wide data structures in a data processing system having a plurality of processors interconnected by a communications link, comprising:

means for sharing virtual storage by each of said plurality of processors during operation of said system;

means for accessing each one of a plurality of virtual storage segments by a same virtual address from any one of said processors during operation of said system;

means for keeping at least two copies of a virtual page, wherein each of said copies is stored in a different processor;

means for updating each of said copies for each of said pages when modified by a completed transaction;

a message queue table stored in a first virtual storage segment having information about a plurality of message queues in the data processing system;

means for issuing a message control system call from a process in any one of said processors to update the control information associated with a queue; and means for updating the control information for the queue in response to a message control system call.

10. The system of claim 9, wherein:

the processor issuing the system call directs the updating means to update all copies of the pages containing the queue.

11. A system for insuring reliability of system-wide data structures in a data processing system having a plurality of processors interconnected by a communications link, comprising:

means for sharing virtual storage by each of said plurality of processors during operation of said system;

means for accessing each one of a plurality of virtual storage segments of said virtual storage by same virtual address from any one of said processors during operation of said system;

means for keeping at least two copies of a virtual page, wherein each of said copies is stored in a different processor;

means for updating each of said copies for each of said pages when modified by a completed transaction;

a message queue table stored in a first virtual storage segment having information about a plurality of message queues int eh data processing system;

means for issuing a message send system call from a process in any one of said processors to send a message to a queue;

means for scanning said message queue table to locate the queue;

means for determining if the queue to which the message is to be sent is full;

means for putting the process originating the message call to sleep if the queue is full;

means for periodically waking up the process to complete the system call; and means for transferring the message to the queue of the queue is not full.

12. The system of claim 11, wherein:

said table stores identifying information about a plurality of message queue headers which have descriptive information about a message associated with the header which is located in the second virtual storage segment; and said system further comprises means for the process to obtain a global lock on said table upon the issuance of the system call and means for freeing the global lock means in response to said determining means determining that the located queue is full.

13. The system of claim 11, wherein:

the processor originating the call automatically directs said updating means to update all copies of the pages containing the queue which receives a message upon completion of the message transfer.

14. A method for insuring reliability for system-wide data structures in a data processing system having a plurality of processors interconnected by a communications link, said method comprising:

sharing virtual storage by each of said plurality of processors during operation of said system;

accessing each one of a plurality of virtual storage segments having a plurality of pages of said virtual storage by a same virtual address from any one of said processors during operation of said system;

keeping at least two copies of each virtual page in a virtual segment, wherein each of said copies is stored in a different processor;

storing information about a plurality of message queues in the data processing system in a message queue table in a first virtual storage segment;

issuing a message get system call from a process of one of said plurality of processors;

scanning the message queue table for an entry for said message queue;

creating a new message queue if no entry is found;

designating the ownership of the new message queue by said processor issuing the system call;

adding an entry to said message queue table for said new message queue; and updating each of the copies for each of said virtual pages when modified by a completed transaction.

15. The method of claim 14, wherein:

copies of the pages containing the message queue and copies of the pages containing the message table are updated upon completion of the message get system call.

16. The method of claim 14, further comprising:

returning the identification of the created message queue to the process issuing the system call after all copies of the message queue and message queue table are updated.

17. A method for insuring reliability of system-wide data structures in a data processing system having a plurality of processors interconnected by a communications link comprising:

sharing virtual storage by each of said plurality of processors during operation of said system;

accessing each one of a plurality of virtual storage segments of said virtual storage by a same virtual address from any one of said processors during operation of said system;

keeping at least two copies of a virtual page, wherein each of said copies is stored in a different processor;

storing information about the identity and location of a plurality of message queues in the data processing system in a message queue table stored in a first virtual storage segment;

storing status information about a plurality of message queues in a message header table stored in a second virtual segment;

storing text information associated with each header in a third virtual segment;

issuing a message control system call from a process in any one of said plurality of processors to remove a message queue;

deleting the message queue from a second virtual storage segment; and deleting the entry for the deleted queue in the message queue table stored in the first virtual segment.

18. The Method of claim 17, wherein:

all copies of the message queue and message queue table are updated upon completion of the message control system call transaction.

19. A method for insuring reliability of system-wide data structures in data processing system having a plurality of processors interconnected by a communications link, comprising:

sharing virtual storage by each of said plurality of processors during operation of said system;

accessing each one of a plurality of virtual storage segments of said virtual storage by a same virtual address for any one of said processors during operation of said system;

keeping at least two copies of each virtual page of a virtual segment, wherein each of said copies is stored in a different processor;

storing information about a plurality of message queues in the data processing system in a message queue table stored in a first virtual storage segment;

issuing a message send system call from a process in any one of said processors to send a message to a queue;

determining if the queue to which the message is to be sent is full;

putting the process originating the message call to sleep if the queue is full;

periodically waking up the process to complete the system call;

transferring the message to the queue if the queue is not full; and updating each of said copies for each of said pages modified.

20. A system for insuring reliability in a data processing system having a plurality of processors interconnected by a communications link, comprising:

means for producing a message from a requesting process in one of said plurality of processors;

means for placing the message from the requesting process in a virtual storage segment accessible by each of said plurality for processors during operation of said system;

means for passing the message to a receiving process;

means for updating in the segment of said virtual storage originally containing the data structure; and means for keeping at least two copies of the virtual storage containing the data, wherein each of the copies is stored in a different processor.

21. A system for insuring reliability of system-wide data structures in a data processing system having a plurality of processors interconnected by a communications link, comprising:

means for sharing virtual storage among the plurality of processors during operation of said system;

means for accessing each one of a plurality of virtual storage segments of said virtual storage by a same address form each of said processors during operation of said system;

means for placing a message in a virtual storage segment by a requesting process; and means for examining said virtual storage segment periodically by a receiving processor for said placed message.

22. A system for insuring reliability of system-wide data structure sin a data processing system having a plurality of processors interconnected by a communications link, said system comprising:

means for sharing virtual storage among the plurality of processors during operation of said system;

means for accessing each one of a plurality of virtual storage segments of said virtual storage by a same address form each one of said processors during operation of said system;

means for storing, in one of said virtual storage segments owned by one of said processors as an owning site, a table for a plurality of data structures;

means for designating another processor to b a back-up processor of the processor owning the table; and means for storing a copy of said table in said back-up processor.

23. The system of claim 22, further comprising:

means for said owning processor to select a new back-up processor if said original back-up processor fails; and means for copying said table to said new back-up processor.

24. The system of claim 22, wherein:

the back-up processor becomes a new owning processor if said existing owning processor fails.

25. The system of claim 24, further comprising:

means for selecting a new back-up processor by said new owning processor and copying said table to the new back-up processor.

26. A method for insuring reliability of system-wide data structures in a data processing system having a plurality of processors interconnected by a communications link, comprising:

storing identifying information about a plurality of data structures in a segment of virtual storage shareable and addressable by each of said processors during operation of said system, wherein a copy of said identifying information is stored in one of a the plurality of processors;

assigning a back-up processor for said processor containing a copy of the identifying information, wherein another copy of said identifying information is also stored in said back-up processor;

issuing a system call, which uses the identifying information to execute an atomic transaction on a data structure store din a virtual storage segment by a process on one of the plurality of processors;

attaching the segment containing the identifying information to each of the processors upon the issuance of the first system call which uses the identifying information; and updating all copies of said identifying information upon the successful completion of the transaction.

27. A system for insuring reliability of system-side data structures in a data processing system having a plurality of processors interconnected by a communication link, wherein each processor shares virtual storage segments, each accessible by a same virtual address from any one of said processors during operation of said system, comprising:

storing identifying information about a plurality of data structures in a segment of virtual storage shareable and addressable by each of said processors, wherein a copy of said identifying information is stored in one of the plurality of processors;

assigning a back-up processor for said processor containing a copy of the identifying information, wherein another copy of said identifying information is also stored in said back-up processor;

issuing a system call, which uses the identifying information to execute an atomic transaction on a data structure stored in a virtual storage segment by a process on one of the plurality of processors;

attaching said segment containing the identifying information to each of said processors upon the issuance of the first system call which uses the identifying information; and maintaining the previous copies of identifying information in the event the transaction is aborted.

28. A system for insuring reliability of system-wide data structures in a data processing system having a plurality of processors interconnected by a communication link, wherein each processor shares virtual storage segments, each accessible by a same virtual address from any one of said processors during operation of said system, comprising:

a table stored in a virtual storage segment having identifying information about a plurality of system-wide data structures, wherein the table is created by one of the processors during the start-up of the system;

means for assigning a back-up processor of the processor owning the virtual storage segment containing the table and storing a copy of said table in said back-up processor;

means for attaching said virtual storage segment containing the table to each of the plurality of processors upon the issuance of a first system call by such processor which uses the identifying information; and means for updating all copies of said table stored in the virtual segment upon the successful completion of the system call.

29. The system of claim 28, further comprising:

means for maintaining the previous copies of the identifying information in the event the system call is aborted.

30. The system of claim 28, wherein:

the table has identifying information about a plurality of message queues.

31. The system of claim 28, wherein:

the table has identifying information about a plurality of semaphores.

32. The system of claim 28, wherein:

the table has identifying information about a plurality of shared storage segments.

33. A system for insuring reliability of system-wide data structures in a data processing system having a plurality of processors interconnected by a communications link, comprising:

means for sharing virtual storage by each of the plurality of processors during operation of said system;

means for accessing each one of a plurality of virtual storage segments of said virtual storage by a virtual address form any one of said processors during operation of said system;

a table created by a first processor for storing in a first virtual storage segment identifying information about a plurality of data structures;

means for assigning at least one back-up processor to said first processor;

means for copying said table int he first processor to said back-up processor;

means for issuing a system call to execute an atomic transaction on a data structure owned by a processor form a process in any one of said plurality of processors;

means for assigning a back-up processor to said processor owning said data structure; and means for updating all copies of the data structure upon the successful completion of the transaction.

34. The system of claim 33, wherein said system further comprises:

means for maintaining the previous copies of the data structure in the event the transaction is aborted.

35. The system of claim 33, further comprising:

means for updating all copies of the identifying information in the table upon the successful completion of the transaction.

* * * * *

UNITED STATES PATENT AND TRADEMARK OFFICE
CERTIFICATE OF CORRECTION

PATENT NO. : 5,222,217                    Page 1 of 2

DATED : June 22, 1993

INVENTOR(S) : M. L. Blount, S. P. Morgan, K. A. V. Rader, R. K. Rader and A. A. Shaheen-Gouda It is certified that error appears in the above-indentified patent and that said Letters Patent is hereby corrected as shown below:

Title page, item [75]    Inventors, please correct last listed inventor to --Amal A. Shaheen-Gouda--;

Col. 8, line 65, after "MSGQHDR", delete ",";

Col. 9, line 28, after "the", delete ".";

Col. 10, line 56, delete "implementation as", insert --implementations--;

Col. 18, line 51, delete "crated", insert --created--;

Col. 19, line 15, delete "is" first occurrence, insert --if--;
   line 62, delete "int eh", insert --in the--;

Col. 20, line 51, delete "int eh", insert --in the--;
   line 63, delete "of", insert --if--;

Col. 21, line 1, delete "the" second occurrence, insert --a--;

Col. 22, line 18, after "in" insert --a--;
   line 26, delete "for", insert --from--;

Col. 23, line 3, delete "form", insert --from--;
   after "each" insert --one--;
   line 11, delete "structure sin", insert --structures in--;
   line 18, delete "form", insert --from--;
   line 23, delete "b", insert --be--;
   line 24, delete "of", insert --for--;

UNITED STATES PATENT AND TRADEMARK OFFICE
CERTIFICATE OF CORRECTION

PATENT NO. : 5,222,217
DATED : June 22, 1993
INVENTOR(S) : M. L. Blount, S. P. Morgan, K. A. V. Rader, R. K. Rader and A. A. Shaheen-Gouda It is certified that error appears in the above-indentified patent and that said Letters Patent is hereby corrected as shown below:

Col. 23, line 50, delete "a";
    line 57, delete "store din", insert --stored in--;
    line 65, delete "system-side", insert --system-wide--;
Col. 24, line 35, delete "of", insert --for--;
Col. 25, line 1, delete "form", insert --from--;
    line 8, delete "int he", insert --in the--; and
    line 12, delete "form", insert --from--.

Signed and Sealed this

Twenty-seventh Day of August, 1996

Attest:

BRUCE LEHMAN

Attesting Officer     Commissioner of Patents and Trademarks